(12) United States Patent
Lee et al.

(10) Patent No.: US 9,423,654 B2
(45) Date of Patent: Aug. 23, 2016

(54) LIQUID CRYSTAL DISPLAY AND MANUFACTURING METHOD THEREOF

(71) Applicant: Samsung Display Co., Ltd., Yongin (KR)

(72) Inventors: Gak-Seok Lee, Busan (KR); Ki Chul Shin, Asan-si (KR); Youn Hak Jeong, Cheonan-si (KR); Hee Hwan Lee, Busan Metropolitan (KR); Joo Seok Yeom, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/588,791

(22) Filed: Jan. 2, 2015

(65) Prior Publication Data

US 2015/0118806 A1 Apr. 30, 2015

Related U.S. Application Data

(62) Division of application No. 13/071,100, filed on Mar. 24, 2011, now Pat. No. 8,953,128.

(30) Foreign Application Priority Data

Nov. 11, 2010 (KR) .................. 10-2010-0112002

(51) Int. Cl.
*G02F 1/1343* (2006.01)
*G02F 1/1337* (2006.01)
(Continued)

(52) U.S. Cl.
CPC ............ *G02F 1/1337* (2013.01); *G02F 1/1368* (2013.01); *G02F 1/133345* (2013.01);
(Continued)

(58) Field of Classification Search
CPC ................... G02F 1/133707; G02F 1/133753; G02F 1/134309; G02F 1/133345; G02F 1/1368; G02F 1/136286; G02F 1/133788; G02F 1/1337; G02F 2201/122; G02F 2001/136295; H01L 21/326; H01L 27/1259; H01L 21/32139
USPC .................................................. 349/141, 143
See application file for complete search history.

(56) References Cited

U.S. PATENT DOCUMENTS 6,081,315 A 6/2000 Matsuyama et al.
6,466,290 B2 10/2002 Kim et al.
(Continued)

FOREIGN PATENT DOCUMENTS

CN 101738808 6/2010
JP 2009251338 10/2009
(Continued)

OTHER PUBLICATIONS

European Search Report dated Feb. 13, 2012, in European Patent Application No. 11166434.8.
(Continued)

*Primary Examiner* — Hoan C Nguyen
(74) *Attorney, Agent, or Firm* — H.C. Park & Associates, PLC

(57) ABSTRACT

A liquid crystal display may include a first substrate, a second substrate facing the first substrate, a liquid crystal layer comprising liquid crystal molecules that are interposed between the first substrate and the second substrate, a first electrode disposed on the first substrate, an insulating layer disposed on the first electrode, a second electrode disposed on the insulating layer, a third electrode disposed on the second substrate, and an alignment layer disposed on any one of the second electrode and the third electrode. The second electrode comprises a fine slit structure, and at least one of the liquid crystal layer and the alignment layer comprises a sub-alignment substance.

10 Claims, 25 Drawing Sheets

(51) Int. Cl.
*G02F 1/1333* (2006.01)
*G02F 1/1362* (2006.01)
*G02F 1/1368* (2006.01)
*H01L 21/3213* (2006.01)
*H01L 21/326* (2006.01)
*H01L 27/12* (2006.01)

(52) U.S. Cl.
CPC .... *G02F1/133707* (2013.01); *G02F 1/133753* (2013.01); *G02F 1/133788* (2013.01); *G02F 1/134309* (2013.01); *G02F 1/136286* (2013.01); *H01L 21/326* (2013.01); *H01L 21/32139* (2013.01); *H01L 27/1259* (2013.01); *G02F 2001/136295* (2013.01); *G02F 2201/122* (2013.01)

(56) References Cited

U.S. PATENT DOCUMENTS

| | | |
|---|---|---|
| 6,642,985 B2 | 11/2003 | Kim et al. |
| 7,256,852 B2 | 8/2007 | Ono et al. |
| 7,450,207 B2 | 11/2008 | Shimoshikiryo |
| 7,486,366 B2 | 2/2009 | Kataoka et al. |
| 7,633,589 B2 | 12/2009 | Choi et al. |
| 8,345,201 B2 | 1/2013 | Mizusaki et al. |
| 2001/0019392 A1 | 9/2001 | Sakamoto et al. |
| 2004/0066480 A1 | 4/2004 | Yoshida et al. |
| 2005/0041186 A1 | 2/2005 | Shimoshikiryo |
| 2005/0162576 A1 | 7/2005 | Sasaki et al. |
| 2007/0002214 A1* | 1/2007 | Sasabayashi ......... G02F 1/1334 349/88 |
| 2009/0002588 A1 | 1/2009 | Lee et al. |
| 2009/0046233 A1 | 2/2009 | Cho et al. |
| 2009/0066900 A1 | 3/2009 | Park et al. |
| 2009/0073367 A1 | 3/2009 | Woo et al. |
| 2009/0103033 A1 | 4/2009 | Chen et al. |
| 2009/0213320 A1 | 8/2009 | Son et al. |
| 2009/0237579 A1 | 9/2009 | Shin et al. |
| 2009/0303424 A1* | 12/2009 | Lee ................... G02F 1/136227 349/122 |
| 2010/0123845 A1 | 5/2010 | Kim et al. |
| 2011/0007256 A1* | 1/2011 | Yoshida ............. G02F 1/34363 349/139 |
| 2011/0128487 A1 | 6/2011 | Kim |
| 2014/0175448 A1* | 6/2014 | Xu ........................ G02F 1/1368 257/72 |

FOREIGN PATENT DOCUMENTS

| | | |
|---|---|---|
| KR | 10-2002-0002052 | 1/2002 |
| KR | 10-2009-0027920 | 3/2009 |
| WO | 2010047011 | 4/2010 |

OTHER PUBLICATIONS

Non-final Office Action dated Mar. 19, 2013, in U.S. Appl. No. 13/071,100.
Final Office Action dated Aug. 7, 2013, in U.S. Appl. No. 13/071,100.
Non-final Office Action dated Dec. 9, 2013, in U.S. Appl. No. 13/071,100.
Final Office Action dated Mar. 20, 2014, in U.S. Appl. No. 13/071,100.
Non-final Office Action dated Jul. 3, 2014, in U.S. Appl. No. 13/071,100.
Notice of Allowance dated Oct. 8, 2014, in U.S. Appl. No. 13/071,100.

* cited by examiner

LIQUID CRYSTAL DISPLAY AND MANUFACTURING METHOD THEREOF

CROSS REFERENCE TO RELATED APPLICATION

This application is a divisional of U.S. patent application Ser. No. 13/071,100, filed on Mar. 24, 2011, and claims the benefit of and priority from Korean Patent Application No. 10-2010-0112002, filed Nov. 11, 2010, each of which is hereby incorporated by reference for all purpose as if fully set forth herein.

BACKGROUND OF THE INVENTION

1. Field of the Invention

Exemplary embodiments of the present invention relate to a liquid crystal display and a manufacturing method thereof.

2. Discussion of the Background

Liquid crystal displays, which are a popular type of flat panel display, are is composed of two panels with field generating electrodes such as a pixel electrode and a common electrode and have a liquid crystal layer therebetween.

Liquid crystal displays display images by controlling the transmission of light through the display from a light source. To control the light transmission, the display generates an electric field in a liquid crystal layer by applying voltages to the field generating electrodes. The electric field determines the alignment of the liquid crystal molecules in the liquid crystal layer, which controls the polarization of light from the light source.

The liquid crystal displays may also have a switching element connected to the pixel electrodes and a plurality of signal lines such as gate lines or data lines, which apply voltage to the pixel electrodes by controlling the switching element.

In the liquid crystal displays, a vertically-aligned mode liquid crystal display arranges the long axes of the liquid crystal molecules perpendicular to the display panel when an electric field is not applied is interesting because this display may have a large contrast ratio and wide viewing angle.

The vertically-aligned mode liquid crystal display may arrange the liquid crystal molecules in various directions using a fringe electric field; however, the display's light transmittance may be reduced by the horizontal component of the electric field in the fringe electric field.

The above information disclosed in this section is only for enhancement of understanding of the background of the invention and may contain information that does not form the prior art.

SUMMARY OF THE INVENTION

Exemplary embodiments of the present invention provide a liquid crystal display and a method of manufacturing the liquid crystal display that may prevent transmittance from being reduced by a horizontal component of the electric field.

An exemplary embodiment of the present invention provides a liquid crystal display including: a first substrate; a second substrate facing the first substrate; a liquid crystal layer including liquid crystal molecules and interposed between the first substrate and the second substrate; a first electrode disposed on the first substrate; an insulating layer disposed on the first electrode; a second electrode disposed on the insulating layer; a third electrode disposed on the second substrate; and an alignment layer disposed on at least one of the second electrode and the third electrode, in which the second electrode includes a fine slit structure and at least one of the liquid crystal layer and the alignment layer includes a sub-alignment substance.

The liquid crystal display further may include: a gate line disposed on the second substrate; a data line crossing the gate line and disposed on the second substrate; and a thin film transistor connected to the gate line and the data line, in which the thin film transistor may be connected with the third electrode.

The first electrode and the third electrode may be plates.

The first electrode may be configured to receive a first voltage, the second electrode may be configured to receive a second voltage, the third electrode may be configured to receive a third voltage, the second voltage and the third voltage being different from each other, and at least one of the liquid crystal layer and the alignment layer may be exposed to radiation from a light source The liquid crystal display may be configured so that, during operation, a vertical electric field is generated by a difference between the first voltage and the third voltage.

The liquid crystal display may be configured so that, during operation, the second electrode is floated, and first voltage and the third voltage are different from each other.

The liquid crystal display may be configured so that, during operation, the first voltage and the second voltage are identical, and both the first voltage and the second voltage are different from the third voltage.

The liquid crystal display may be configured so that, during operation, the first voltage, the second voltage, and the third voltage are different from each other.

The thickness of the insulating layer may be less than or equal to 3.5 μm.

The dielectric constant of the insulating layer may ranges from 1.5 to 8.5.

The second electrode may include a cross stem including a transverse stem and a longitudinal stem intersecting the transverse stem, and a plurality of fine branches extending from the cross stem.

The second electrode may include a plurality of regions corresponding to groups of fine branches that extend in different directions from the cross stem.

The second electrode may include a cross opening including a transverse opening and a longitudinal opening, and a plurality of fine opening patterns extending from the cross opening.

The second electrode may include fine branches disposed between the fine opening patterns, and an edge pattern connecting ends of the fine branches.

The alignment layer may comprise the sub-alignment substance, and the sub-alignment substance has a negative dielectric anisotropy.

The alignment layer may include a main-chain and a side-chain connected to the main-chain, and the sub-alignment substance may be connected to the side-chain.

Another exemplary embodiment of the present invention provides a method of manufacturing a liquid crystal display, including: forming a first electrode on a first substrate; forming an insulating layer on the first electrode; forming a second electrode on the insulating layer; forming a third electrode on a second substrate facing the first substrate; forming an alignment layer on at least one of the second electrode and the third electrode; assembling the first substrate with the second substrate; disposing a liquid crystal layer between the first substrate and the second substrate; applying different voltages to the second electrode and the third electrode; and radiating light to the liquid crystal layer while applying the different voltages to the second electrode and the third electrode, in which the second electrode comprises formed in a fine slit structure, and at least one of the liquid crystal layer and the alignment layer includes a sub-alignment substance.

The method of manufacturing a liquid crystal display may further include forming a gate line on the second substrate, forming a data line crossing the gate line and disposed on the second substrate, and forming a thin film transistor connected to the gate line and the data line, in which the thin film transistor may be connected to the third electrode.

The method of manufacturing a liquid crystal display may further include applying a first voltage (V1) to the first electrode, wherein applying different voltages to the second electrode and the third electrode comprises: applying a second voltage (V2) to the second electrode; and applying a third voltage (V3) to the third electrode, wherein the first voltage, the second voltage, and the third voltage satisfy the condition that |V2−V3|≥|V1−V3|

The applying different voltages to the second electrode and the third electrode may include changing the second voltage while maintaining the first voltage and the third voltage.

The method of manufacturing a liquid crystal display may further include increasing the first voltage after beginning the change in the second voltage.

The method of manufacturing a liquid crystal display may further include radiating light to the liquid crystal layer, without an electric field, after radiating light to the liquid crystal layer.

The forming of a first electrode, an insulating layer, and a second electrode on the first substrate may include sequentially forming a first transparent electrode layer, an insulating material layer, and a second transparent electrode layer on the first substrate, forming a photoresist pattern on the second transparent electrode layer, etching the second transparent electrode layer, using the photoresist pattern as a mask, and etching the insulating material layer, using the photoresist pattern as a mask.

Another exemplary embodiment of the present invention provides a liquid crystal display, comprising: a first panel comprising a first electrode; and a second panel facing the first panel and comprising: a substrate; a second electrode disposed on the substrate; an insulating layer disposed on the second electrode; and a third electrode comprising slits and disposed on the insulating layer, wherein the first electrode is configured to receive a first voltage (V1), the second electrode is configured to receive a second voltage (V2), the third electrode is floated, and the first voltage and the third voltage satisfy the condition that V1≠V2.

The liquid crystal display may be configured so that, during operation, a vertical electric field is generated by a difference between the first voltage and the second voltage.

The third electrode may be disposed in a pixel region.

Exemplary embodiments of the present invention also provide a liquid crystal display with high transmittance and high response for alignment of liquid crystal molecules.

Additional features of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
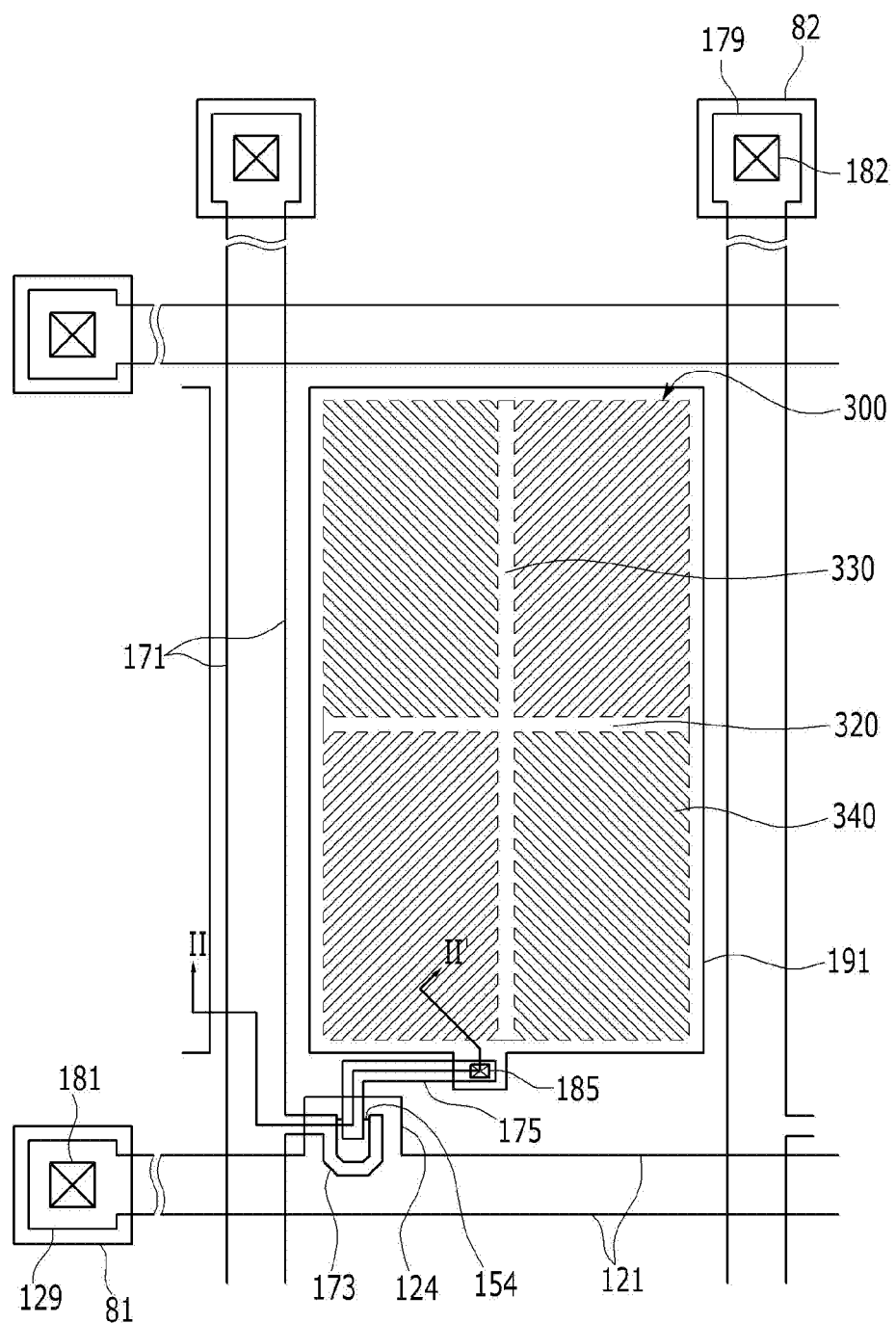
FIG. 1 is a layout view showing a liquid crystal display according to an exemplary embodiment of the present invention.

The present invention will be described more fully hereinafter with reference to the accompanying drawings in which exemplary embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected is to, directly coupled to the other element or layer, or intervening elements or layers may be present. In contrast, when an element is referred to as being "directly on," "directly connected to," or "directly coupled to" another element or layer, there are no intervening elements or layers present. Further, the thickness of layers and regions may be exaggerated for clarity in the drawings.

Figure 2:
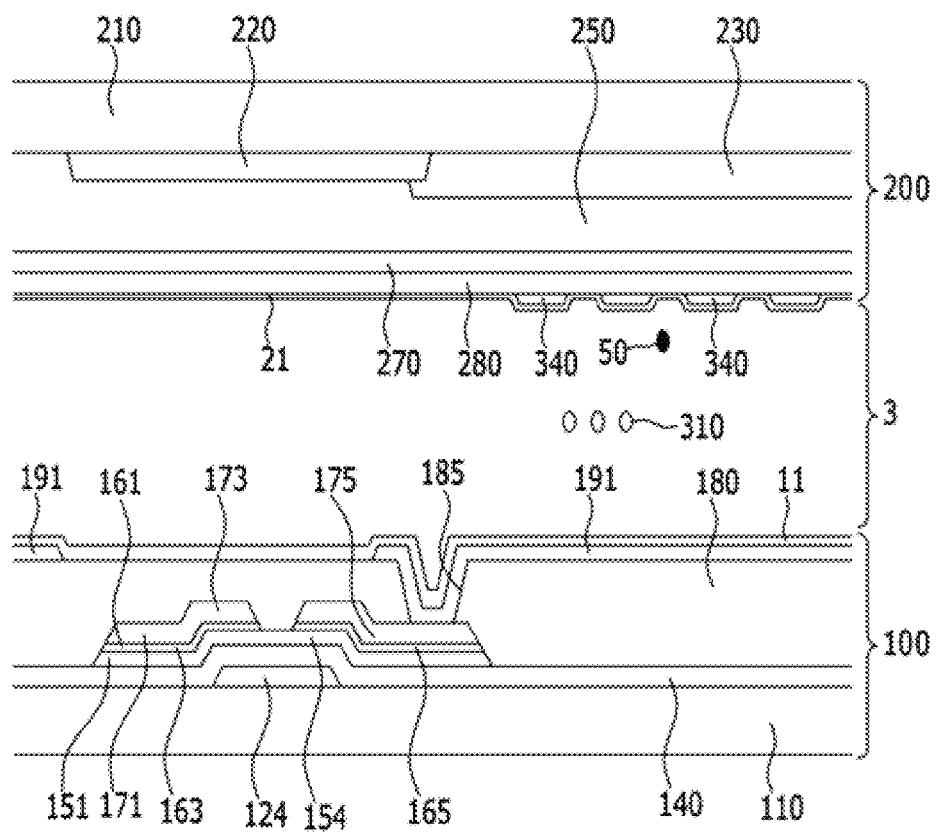
FIG. 2 is a cross-sectional view taken along line II-II' of FIG. 1.

FIG. 1 is a layout view showing a liquid crystal display according to an exemplary embodiment of the present invention. FIG. 2 is a cross-sectional view taken along line II-II' of FIG. 1.

Referring to FIG. 1 and FIG. 2, a liquid crystal display according to the exemplary embodiment includes a lower panel 100 and an upper panel 200, which are opposite to each other, a liquid crystal layer 3 disposed between the display panels 100 and 200, and a pair of polarizers (now shown) attached to the outer sides of the display panels 100 and 200.

The upper panel 200 has a light blocking member 220 on a transparent and insulating upper substrate 210, which is a first substrate. The light blocking member 220 is also called a black matrix and prevents light leakage between pixel electrodes 191 on the lower display panel 100, which is described below. The light blocking member 220 has a plurality of openings having substantially the same shapes as those of the pixel electrodes 191 and arranged opposite of the pixel electrodes 191. The light blocking member 220, however, may be composed of a portion corresponding to a gate line 121 and a data line 171 and a portion corresponding to a thin film transistor.

A plurality of color filters 230 is further on the substrate 210. Most of the color filters 230 are in the region surrounded by the light blocking member 220 and may longitudinally extend along the column of the pixel electrodes 191. The color filter 230 may be colored as one is of the primary colors, e.g., red, green and blue. However, the color filter 230 is not limited to the three primary colors of red, green and blue and may also have one of a cyan-based, a magenta-based, a yellow-based, and a white-based color.

At least one of the light blocking member 220 and the color filter 230 may be formed on the lower substrate 110.

An overcoat 250 may be arranged on the color filter 230 and the light blocking member 220. The overcoat 250 may be made of an insulating material and may prevent the color filter 230 from being exposed and provides a flat surface. The overcoat 250 may be omitted.

A common electrode 270 may be arranged on the overcoat 250. The common electrode 270 may be formed as a plate in a pixel region. The common electrode, when formed as a plate, may be a non-split whole plate.

An insulating layer 280 may be disposed on the common electrode 270. The insulating layer 280 may have a thickness of less than or equal to 3.5 μm and may have a dielectric constant from about 1.5 to about 8.5.

A fine slit electrode 300 including a transverse stem 320, a longitudinal stem 330, a fine branch 340 is disposed on the insulating layer 280. The fine slit electrode 300 may be electrically connected with the common electrode 270 or may be floated. The fine slit electrode 300 is described in detail below.

The lower panel 100 is described next.

A plurality of gate lines 121 is disposed on the insulating lower substrate 110, which corresponds to a second substrate. The gate lines 121 may extend transversely, transmitting gate signals. The gate lines 121 include a gate electrode 124 protruding upward and is a wide end 129 for connecting with another layer or a gate driver (not shown). The gate drivers (not shown) may be disposed on the lower substrate 110, and the gate lines 121 may extend to be connected to them.

A gate insulating layer 140 made of an insulating material, such as silicon nitride, is disposed on the gate lines 121.

A plurality of semiconductor layers 151 may be made of hydrogenated amorphous silicon or polysilicon is disposed on the gate insulating layer 140. The semiconductor layer 151 may extend longitudinally and includes a plurality of projections 154 protruding due to the height of the gate electrode 124.

A plurality of ohmic contact stripes 161 and ohmic contact islands 165 are disposed on the protrusion 154 of the semiconductor layer 151. The ohmic contact stripe 161 has a plurality of protrusions 163, and the protrusions 163 and the ohmic contact islands 165 are arranged in pairs on the projections 154 of the semiconductor layer 151.

Data conductors 171 and 175 including a plurality of data lines 171 and a plurality of drain electrodes 175 are disposed on the ohmic contacts 161 and 165 and the gate insulating layer 140.

The data lines 171 transmit data signals and may extend longitudinally to cross with the gate lines 121. The gate lines 121 and the data lines 171 are insulated from each other by the gate insulating layer 140. Each data lines 171 includes a plurality of source electrodes 173 that extend in a U-shape toward the gate electrode 124 and a wide end 179 having a large area for connecting with another layer or the data driver (not shown).

The drain electrode 175 is separated from the data line 171 and the source electrode 173 and extends upward in the middle of the U-shape of the source electrode 173.

Data conductors 171 and 175, semiconductor layers 151 and 154, and ohmic contacts 161, 163, and 165 under the data conductors may be simultaneously formed using one mask.

A passivation layer 180 is on the data conductors 171 and 175 and the exposed semiconductor layer 154. The passivation layer 180 may be made of an inorganic insulating material such as silicon nitride and silicon oxide, or the passivation layer 180 may be made of an organic insulating material and may attain a flat surface. When made of an organic insulating material, the passivation layer 180 may have photosensitivity and may have a dielectric constant of less than or about 5.0. The passivation layer 180 may also have a double layer structure of an upper organic layer and a lower inorganic layer to protect the exposed portion of the semiconductor 154 from damage while maintaining high electrical insulation, characteristic of insulating organic materials.

A contact hole 185 that exposes the drain electrode 175 is formed in the passivation layer 180.

A plurality of pixel electrodes 191 and a plurality of contact assistants 81 and 82 are disposed on the passivation layer 180 and may be made of transparent conductive materials, such as indium tin oxide (ITO) or indium zinc oxide (IZO), or a reflective metal, such as aluminum, silver, chromium, or alloys of them.

The pixel electrode 191 may be formed in a plate for each unit pixel region.

Alignment layers 11 and 21 are disposed on the inner sides of the lower and upper panels 100 and 200, respectively, and may be vertical mode type of alignment layers.

Polarizers (not shown) may be disposed on the outer sides of the lower and upper panels 100 and 200 and may have their polarization axes orthogonal to each other with one of the is polarizer's polarization axis parallel to the gate line 121. One of the polarizers may be omitted if the display is a reflective liquid crystal display.

A liquid crystal layer 3 is interposed between the upper and lower panels 100 and 200 and includes liquid crystal molecules 310 having a negative dielectric anisotropy. The liquid crystal molecules 310 in the liquid crystal layer 3 may have a pretilt such that the long axes are substantially parallel to the longitudinal direction of the fine branch 340 of the fine slit electrode 300 and may be aligned to be perpendicular to the surfaces of the display panels 100 and 200 when an electric field is not applied. Further, the liquid crystal layer 3 further includes a sub-alignment substance 50 containing at least one reactive mesogen, such that the liquid crystal molecules 310 may have the pretilt such that the long axes are substantially parallel with the longitudinal direction of the fine branch 340 of the fine slit electrode 300 by the sub-alignment substance 50.

In another exemplary embodiment of the present invention, the sub-alignment substance 50 may be included in the alignment layers 11 and 21 instead of within the liquid crystal layer 3. In this case, the constituent compounds of the alignment layers 11 and 21 may include a main-chain and a side-chain so that the sub-alignment substance 50 may connect with the side-chain and may have negative dielectric anisotropy. As an additional exemplary embodiment, the sub-alignment substance 50 may be included in both the liquid crystal layer 3 and the alignment layers 11 and 21.

The sub-alignment substance 50 with negative dielectric anisotropy and connected with the side-chain of the alignment layers 11 and 21 may have the structure shown in Formula 1 below. The sub-alignment substance 50 with negative dielectric anisotropy may be more easily aligned by an electric field than a sub-alignment substance 50 that has a neutral dielectric anisotropy. This is because the sub-alignment substance 50 with neutral dielectric anisotropy has very little internal energy permutation in the presence of an electric field, as compared with the sub-alignment substance 50 that may connect with the side-chain of the alignment layers 11 and 21.

Formula 1

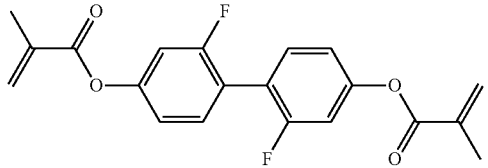

The fine slit electrode 300 is described below with reference to FIG. 3.

Figure 3:
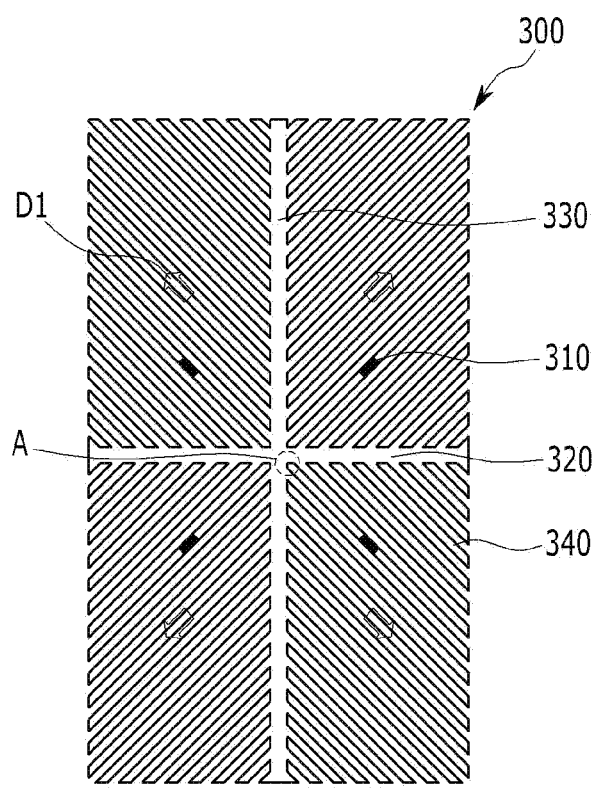
FIG. 3 is a layout view showing a fine slit electrode of the exemplary embodiment shown in FIG. 1.

FIG. 3 is a layout view showing the fine slit electrode 300 of the exemplary embodiment shown in FIG. 1.

Referring to FIG. 3, the shape of the fine slit electrode 300 is a quadrangle and includes a cross stem composed of a transverse stem 320 and a longitudinal stem 330 intersecting the transverse stem 320. Further, four sub-regions are defined by the transverse stem 320 and the longitudinal stem 330, and each of the sub-regions includes a plurality of fine branches 340.

Ones of the fine branches 340 of the fine slit electrode 300 extend at an angle to the left upper side from the transverse stem 320 or the longitudinal stem 330 and other fine branches 340 extend at an angle to the right upper side from the transverse stem 320 or the longitudinal stem 330. Further, ones of the fine branches 340 extend at an angle to the left lower side from the transverse stem 320 or the longitudinal stem 330 and the other fine branches 340 extend at an angle to the right lower side from the transverse stem 320 or the longitudinal stem 330. The fine branches 340 of two adjacent sub-regions may be perpendicular to each other. Further, the fine branches 340 of two adjacent sub-regions may not be perpendicular but may is form obtuse or acute angles with respect to each other, and the distribution of angles between neighboring sub-regions may not be constant. Though not shown, the width of the fine branch 340 may gradually increase either away or toward the longitudinal and transverse stems 330 and 320.

Figure 4:
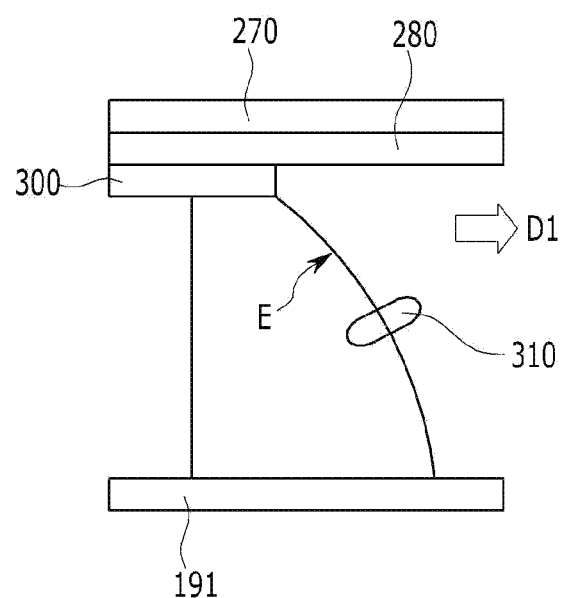
FIG. 4 is a cross-sectional view showing an electric field direction of the exemplary embodiment of FIG. 3.

FIG. 4 is a cross-sectional view showing an electric field direction within the portion indicated by "A" of the exemplary embodiment shown in FIG. 3.

Referring to FIG. 4, a fringe field is generated, when voltage is applied to the fine slit electrode 300 and the pixel electrode 191. Within the electric field, the liquid crystal molecules 310 align toward the outside of the pixel region, i.e., in a direction shown by arrow D1 in FIG. 3 and FIG. 4. In detail, the liquid crystal molecules 310 are arranged in a predetermined direction because only strong fringe fields exist at areas corresponding to non-electrodes between the fine branches 340 of the fine slit electrode 300. The final domain direction of the whole liquid crystal molecules is determined by the internal energy among the liquid crystal molecules 310 aligned in the predetermined direction by means of a vertical electric field established by the fine branches 340.

Figure 5:
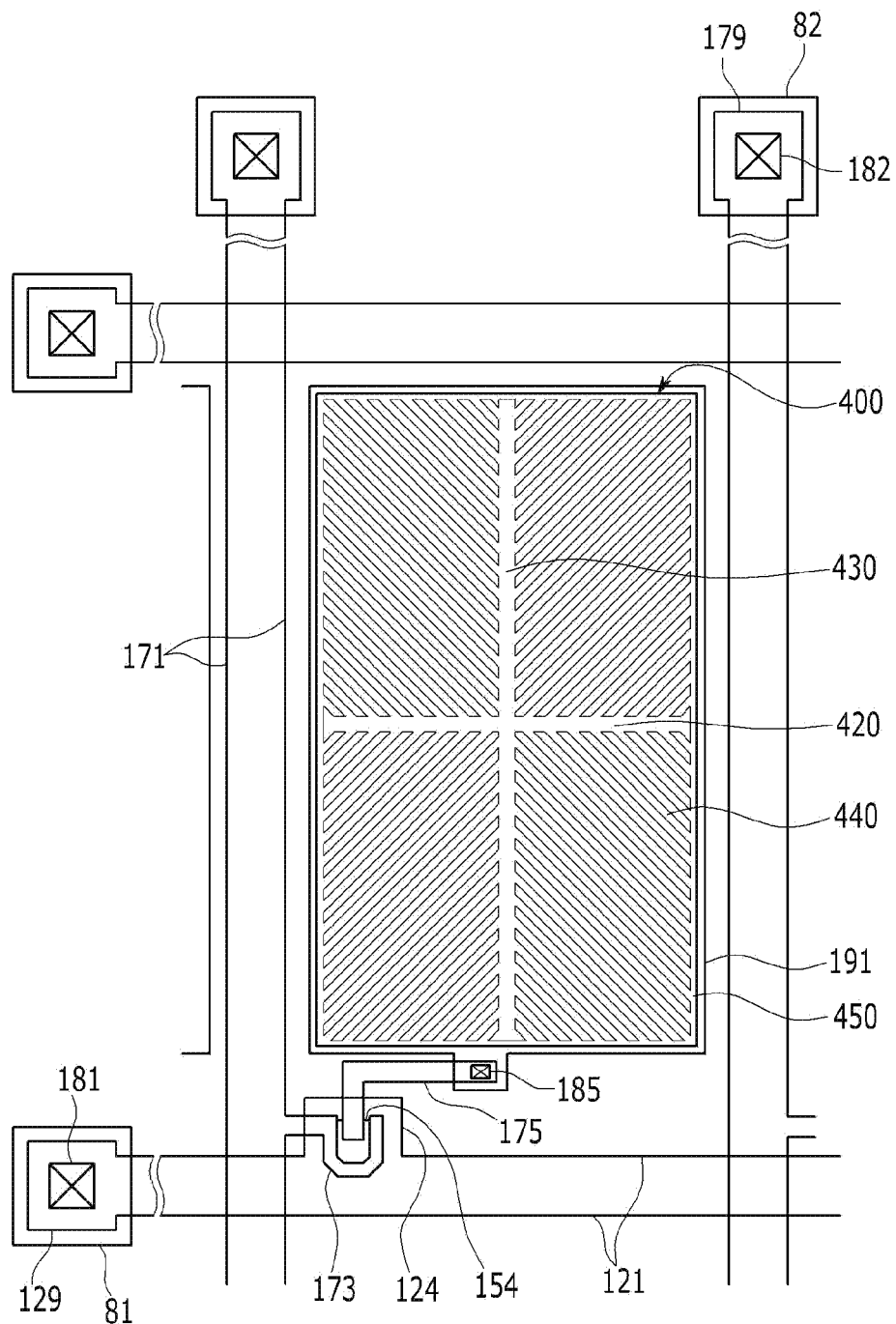
FIG. 5 is a layout view showing a liquid crystal display according to another exemplary embodiment of the present invention.
Figure 6:
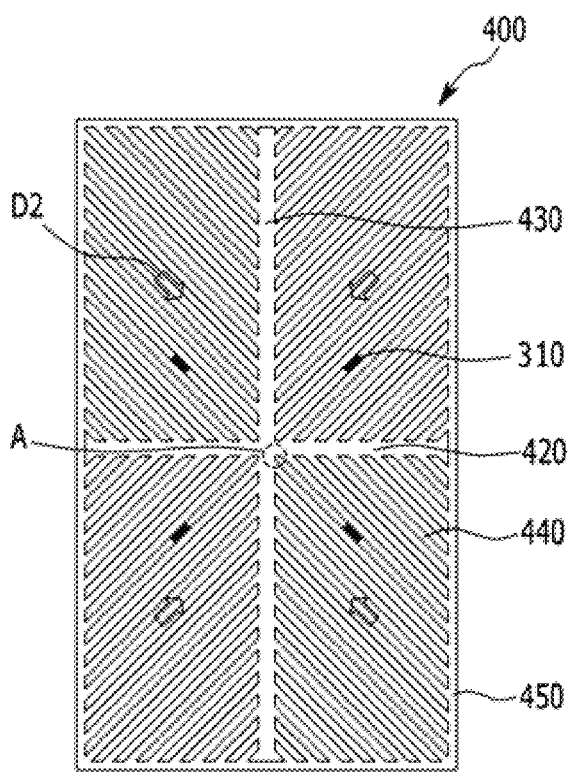
FIG. 6 is a layout view showing a fine slit electrode in the exemplary embodiment shown in FIG. 5.

Hereinafter, a liquid crystal display according to another exemplary embodiment of the present invention is described with reference to FIG. 5, FIG. 6, and FIG. 7. FIG. 5 is a layout view showing a liquid crystal display according to another exemplary embodiment of the present invention. FIG. 6 a layout view showing a fine slit electrode of the exemplary embodiment shown in FIG. 5.

Referring to FIG. 5 and FIG. 6, a liquid crystal display according to the exemplary embodiment has a structure similar to that of the liquid crystal display of the exemplary embodiment shown in FIG. 2. The descriptions for the similar parts may not be repeated.

The liquid crystal display according to the exemplary embodiment has a different structure for the fine slit electrode from the liquid crystal display according to the exemplary embodiment shown in FIG. 1 and FIG. 2. The liquid crystal display according to the exemplary embodiment includes a cross opening composed of a transverse opening 420 and a longitudinal opening 430 intersecting the transverse opening 420. Further, four sub-regions are defined by the transverse opening 420 and the longitudinal opening 430, and each sub-region includes a plurality of fine branches 440. A plurality of fine opening patterns extending from the cross opening is formed between the fine branches 440. In the exemplary embodiment, the fine slit electrode 400 includes a quadrangular edge pattern 450 connecting the fine branches 440. That is, the edge pattern 450 connects the fine branches 440 at one end of each of the fine branches 440.

Many characteristics of the liquid crystal display according to the exemplary embodiment shown in FIG. 1 and FIG. 2 may be applied to the liquid crystal display according to the exemplary embodiment shown in FIG. 5 and FIG. 6.

Figure 7:
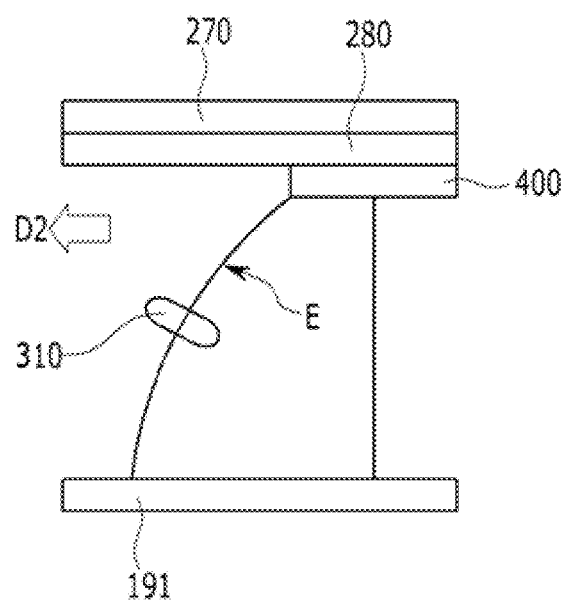
FIG. 7 is a cross-sectional view showing an electric field direction of the exemplary embodiment of FIG. 6.

FIG. 7 is a cross-sectional view showing an electric field direction of the exemplary embodiment shown in FIG. 6. In detail, FIG. 7 shows an electric field direction at the portion indicated by "A" in FIG. 6.

Referring to FIG. 7, a fringe field is generated, when voltage is applied to the fine slit electrode 400 and the pixel electrode 191, such that the liquid crystal molecules 310 align their long axes toward the inside of the pixel region (as indicated by the arrows D2 in FIG. 6 and FIG. 7). In detail, the liquid crystal molecules 310 are arranged, i.e., aligned, in a predetermined direction because only strong fringe electric fields exist at the interface between regions of non-electrode portions and the fine branches 440 of the fine slit electrode 400. The is final domain direction of ensembles of liquid crystal molecules in the sub-regions is determined by the strength of the perturbation of the internal energy among the liquid crystal molecules 310 aligned in the predetermined direction by means of the vertical electric field established by the pixel electrode 191 and the fine branches 440.

Figure 8:
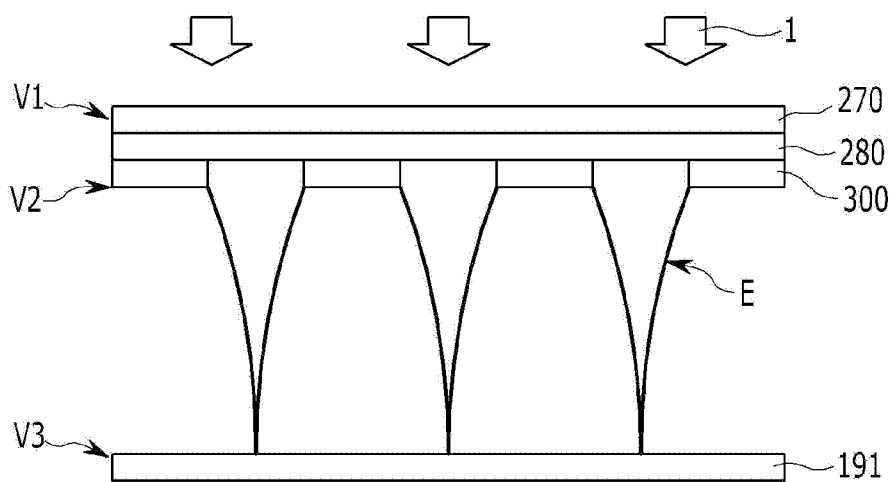
FIG. 8 is a cross-sectional view showing a liquid crystal display according to another exemplary embodiment of the present invention.

Hereinafter, a method of manufacturing a liquid crystal display according to another exemplary embodiment of the present invention is described with reference to FIG. 1, FIG. 2, and FIG. 8. FIG. 8 is a cross-sectional view showing a liquid crystal display according to another exemplary embodiment of the present invention.

Referring to FIG. 1 and FIG. 2, the manufacture of the first display panel 100 and the second display panel 200 are described first.

The upper panel 200 may be manufactured as follows.

The light blocking member 220 and the color filters 230 are formed on the first substrate 210, and then an overcoat 250 is formed thereon. The common electrode 270 is formed on the overcoat 250, and then the insulating layer 280 is formed thereon. The fine slit electrode 300 including the transverse stem 320, the longitudinal stem 330, and the fine branches 340 is formed on the insulating layer 280. Subsequently, the alignment layer 21 is formed on the fine slit electrode 300.

The lower panel 100 may be manufactured as follows.

The gate line 121 including the gate electrode 124, the gate insulating layer 140, the semiconductor layers 151 and 154, the data line 171 including the source electrode 173, the drain electrode 175, and the passivation layer 180 are formed on the second substrate 110 by disposing and patterning a plurality of thin layers.

The pixel electrode 191 is formed by disposing and patterning a conductive layer is made of ITO or IZO on the passivation layer 180. Next, the alignment layer 11 is disposed on the pixel electrode 191.

Thereafter, the lower panel 100 and the upper panel 200, which have been made as described above, are coupled, and the liquid crystal layer 3 is formed by injecting a mixture of the liquid crystal molecules 310 and the sub-alignment substance 50 between the lower and upper panels 100 and 200. Alternatively, the liquid crystal layer 3 may be formed by applying a mixture of the liquid crystal molecules 310 and the sub-alignment substance 50 on the lower panel 100 or the upper panel 200. Although the sub-alignment substance 50 may be contained in the liquid crystal layer 3 in the exemplary embodiment, the sub-alignment substance 50 may be contained in the alignment layers 11 and 12 instead of the liquid crystal layer 3 as another exemplary embodiment.

Thereafter, referring to FIG. 8, a voltage is applied to the pixel electrode 191 and the fine slit electrode 300. A first voltage V1 may be applied to the common electrode 270; a second voltage V2 may be applied to the fine slit electrode 300, and a third voltage V3 may be applied to the pixel electrode 191. The second voltage V2 and the third voltage V3 may be different, but under some conditions these voltages may be the same.

Generally, a voltage may be applied to the electrodes 191, 270, and 300 such that the first voltage V1, the second voltage V2, and the third voltage V3 satisfy the following condition (1).

$$|V2-V3| \geq |V1-V3| \tag{1}$$

That is, a fringe field E is generated when the magnitude of the difference between the second voltage V2 and the third voltage V3 is greater than magnitude of the difference of the first voltage V1 and the third voltage V3.

Next, with the fringe field E of FIG. 8 generated, light is radiated to the liquid crystal display according to the exemplary embodiment. Accordingly, the liquid crystal molecule 310 may be provided with a pretilt.

Figure 9:
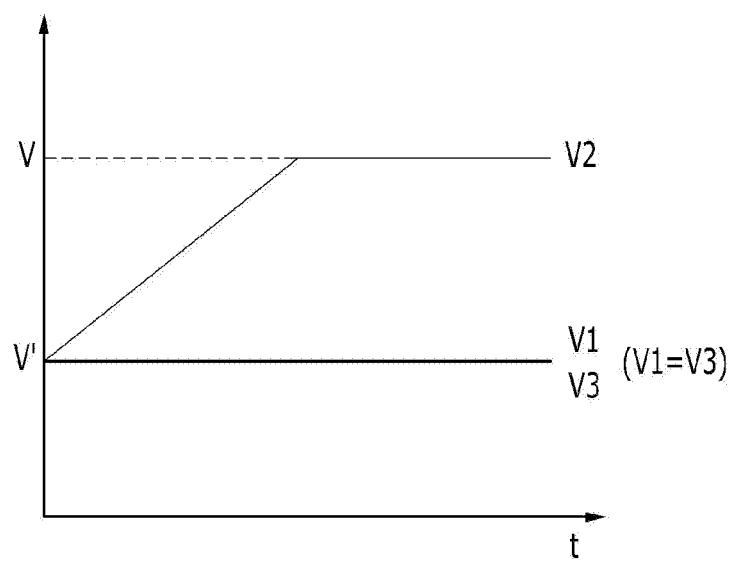
FIG. 9 is a graph showing voltage applied under electric field exposure in the method of manufacturing a liquid crystal display according to another exemplary embodiment of the present invention.
Figure 10:
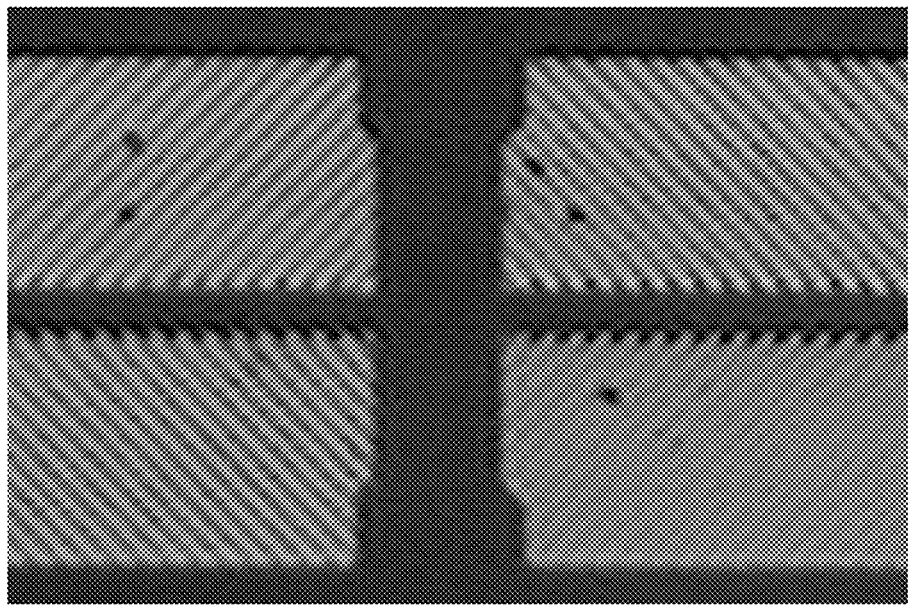
FIG. 10 is an optical microscopy picture of a fine slit electrode in a liquid crystal display of the exemplary embodiment of FIG. 9.

FIG. 9 is a graph showing voltage applied under electric field exposure in the method of manufacturing a liquid crystal display according to another exemplary embodiment of the present invention. FIG. 10 is an optical microscopy picture of a fine slit electrode in a liquid crystal display of the exemplary embodiment of FIG. 9.

Referring to FIG. 9, when an electric field is present and light is radiated, the second voltage V2 is gradually increased as the first voltage V1 and the third voltage V3 are kept constant so that texture may not be generated by the fringe field between the upper substrate 210 and the lower substrate 110. In this manner, the liquid crystal direction may be controlled.

Figure 11:
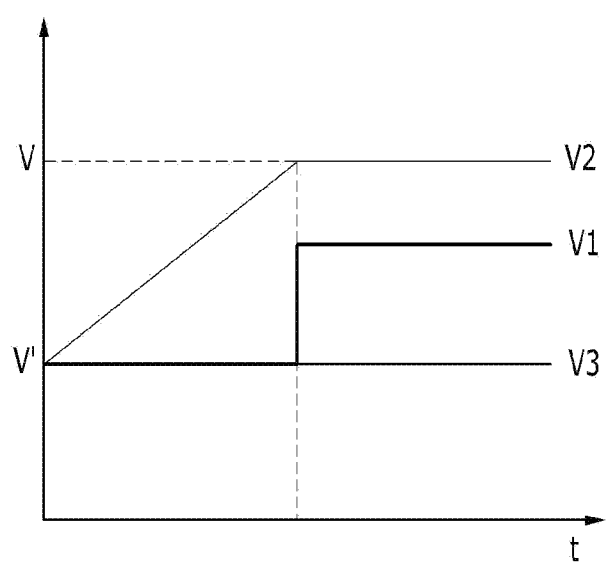
FIG. 11 is a graph showing voltage applied under electric field exposure in the method of manufacturing a liquid crystal display according to another exemplary embodiment.

FIG. 11 is a graph showing voltage applied under electric field exposure in the method of manufacturing a liquid crystal display according to another exemplary embodiment.

Figure 12:
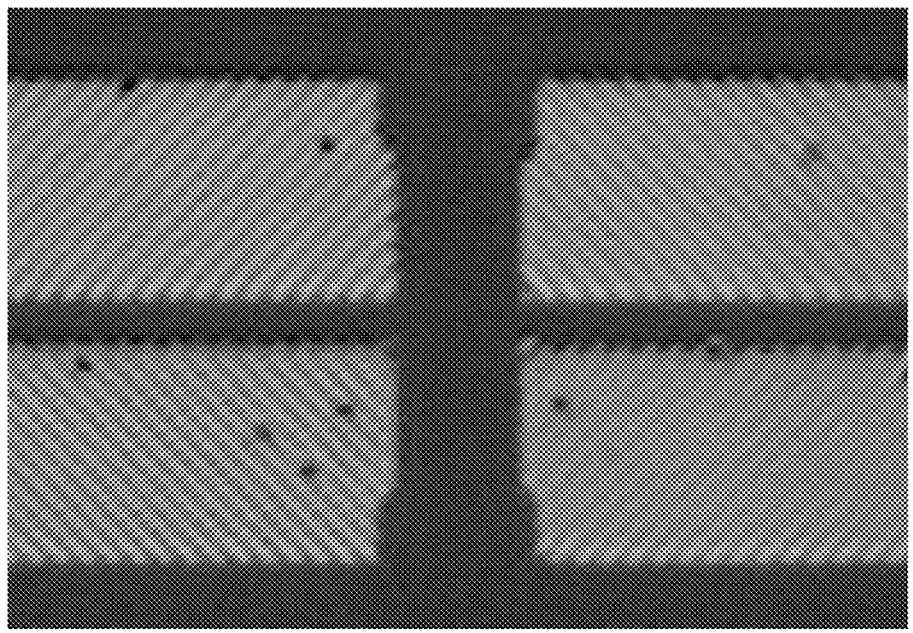
FIG. 12 is an optical microscopy picture of a fine silt electrode in a liquid crystal display manufactured by the exemplary embodiment of FIG. 11.

FIG. 12 is an optical microscopy picture of a fine silt electrode in a liquid crystal display manufactured by the exemplary embodiment of FIG. 11.

Referring to FIG. 11, uniform control of the pretilt of the liquid crystal molecules may be established at the portions of the fine slit electrode by additionally increasing the first voltage V1 after a predetermined time. This may be accomplished in the method of applying voltage with electric field exposure as described with reference to the exemplary embodiment shown in FIG. 9. FIG. 11 shows the time when the first voltage V1 increases (in a step function manner) occurs when the second voltage V2 becomes constant, which is an exemplary embodiment of the present invention. The time when the first voltage V1 increases may be earlier or later than the time when the second voltage V2 becomes constant in another is exemplary embodiment.

Comparing FIG. 10 with FIG. 12, dark portions (e.g., the dark stripes) generated at the non-electrodes of the fine slit electrode decreased more in the liquid crystal display manufactured by the exemplary embodiment shown in FIG. 11 than for the liquid crystal display manufactured by the exemplary embodiment shown in FIG. 9.

Figure 13:
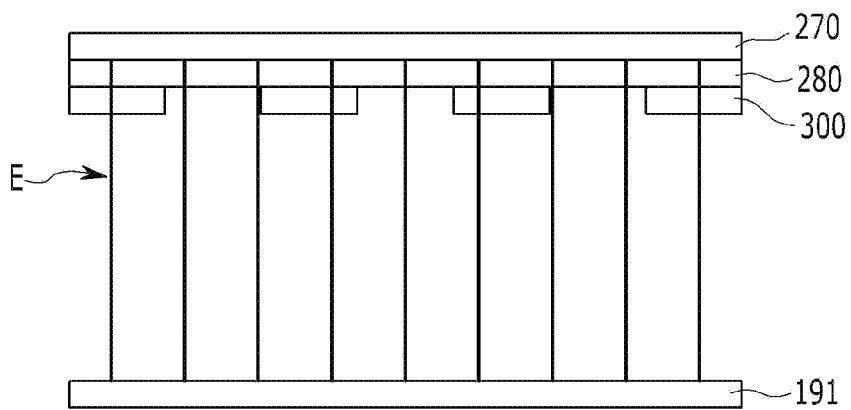
FIG. 13 is a cross-sectional view showing an electric field direction when activating a liquid crystal display manufactured by the exemplary embodiment shown in FIG. 8.

FIG. 13 is a cross-sectional view showing an electric field direction when activating a liquid crystal display manufactured by the exemplary embodiment shown in FIG. 8.

The liquid crystal display according to the exemplary embodiment may operate in one of the following conditions (2), (3), and (4).

$$V1 \neq V3 \text{(fine slit electrode floated)} \tag{2}$$

$$V1 = V2 \neq V3 \tag{3}$$

$$V1 \neq V2 \neq V3 \tag{4}$$

In the exemplary embodiment, the liquid crystal molecules may be aligned between the common electrode 270 and the pixel electrode 191 by the vertical electric field E in any of the above conditions (2), (3), and (4). That is, as shown in FIG. 13, the vertical electric field E is generated between the common electrode 270 and the pixel electrode 191.

Therefore, the liquid crystal molecules are usually aligned by only the vertical electric field while the liquid crystal display operates so the reduction of transmittance due to the vertical electric field may be minimized and high-speed response may be implemented.

Figure 14:
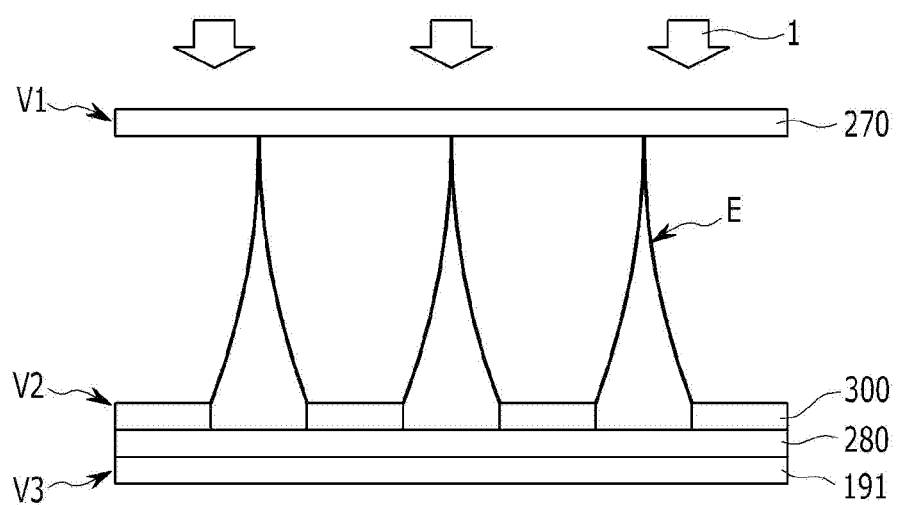
FIG. 14 is a cross-sectional view showing an electric field direction under electric field exposure in the method of manufacturing a liquid crystal display according to another exemplary embodiment of the present invention.
Figure 15:
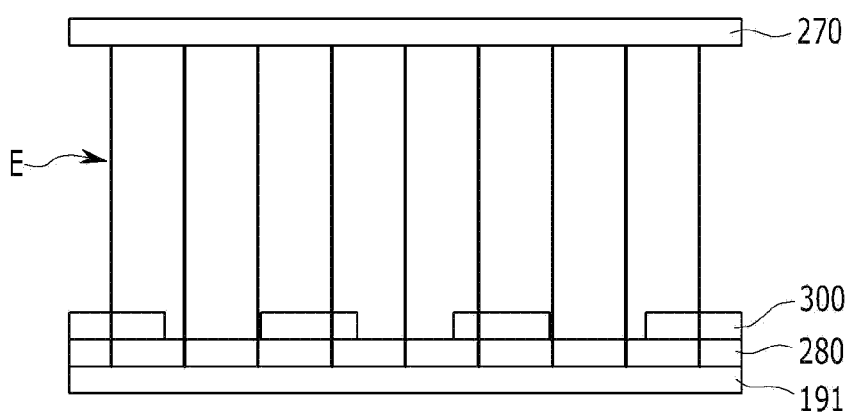
FIG. 15 is a schematic cross-sectional view showing an electric field direction when activating a liquid crystal display manufactured by the exemplary embodiment shown in FIG. 14.

Hereinafter, a method of manufacturing a liquid crystal display according to another exemplary embodiment of the present invention is described with reference to FIG. 14 and FIG. 15. FIG. 14 is a cross-sectional view showing an electric field direction under electric field exposure in the method of manufacturing a liquid crystal display according to another is exemplary embodiment of the present invention. FIG. 15 is a cross-sectional view showing an electric field direction when activating a liquid crystal display manufactured by the exemplary embodiment shown in FIG. 14.

Referring to FIG. 14 and FIG. 15, a fine slit electrode 300 is formed in the liquid crystal display with a pixel electrode 191 and an insulating layer 280 therebetween, unlike the liquid crystal display according to the exemplary embodiment shown in FIG. 8 and FIG. 13.

Referring to FIG. 14, voltage is applied to a common electrode 270 and the fine slit electrode 300 for electric field exposure. A first voltage V1 is applied to the common electrode 270; a second voltage V2 is applied to the fine slit electrode 300, and a third voltage V3 is applied to the pixel electrode 191. An electric field is established between the common electrode 270 and the fine slit electrode 300 when the first voltage V1 and the second voltage V2 are different.

In detail, a voltage is applied to the electrodes 191, 270, and 300 such that the first voltage V1, the second voltage V2 and the third voltage V3 satisfy the following condition (5).

$$|V2-V1| \geq |V3-V1| \quad (5).$$

That is, a fringe field E is generated when the magnitude of the difference between the second voltage V2 and the first voltage V1 is greater than the magnitude of the difference between the third voltage V3 and the first voltage V1.

Next, light is radiated (as indicated by arrows 1) to the liquid crystal display according to the exemplary embodiment with the fringe field E of FIG. 14 generated. Accordingly, the liquid crystal molecule 310 may be pretilted.

Many characteristics of the method of manufacturing the liquid crystal display is according to the exemplary embodiment shown in FIG. 8 may be applied to the exemplary embodiment shown in FIG. 14.

Referring to FIG. 15, the liquid crystal display manufactured by the exemplary embodiment show in FIG. 14 may operate, within any one of the following conditions (6), (7), and (8).

$$V1 \neq V3 \text{(fine slit electrode floated)} \quad (6).$$

$$V2=V3 \neq V1 \quad (7).$$

$$V1 \neq V2 \neq V3 \quad (8).$$

In the exemplary embodiment, the liquid crystal molecules may move (e.g., rotate) in their positions between the common electrode 270 and the pixel electrode 191 by exertion of the vertical electric field E with any one of the conditions (6), (7), and (8) being satisfied. That is, as shown in FIG. 15, the vertical electric field E is generated between the common electrode 270 and the pixel electrode 191.

Therefore, the liquid crystal molecules may move due to the vertical electric field when the liquid crystal display operates so that reduction of transmittance due to the vertical electric field may be decreased, and the display may exhibit a high-speed response.

Figure 16:
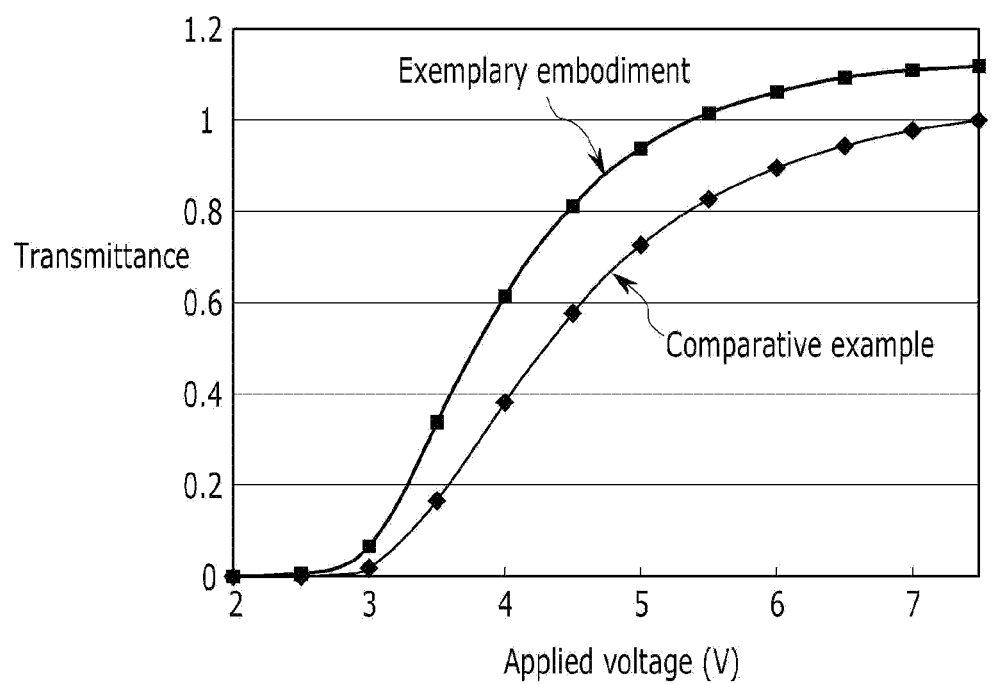
FIG. 16 is a graph showing transmittance as a function of voltage applied to the liquid crystal layer in a liquid crystal display according to an exemplary embodiment of the present invention.
Figure 17:
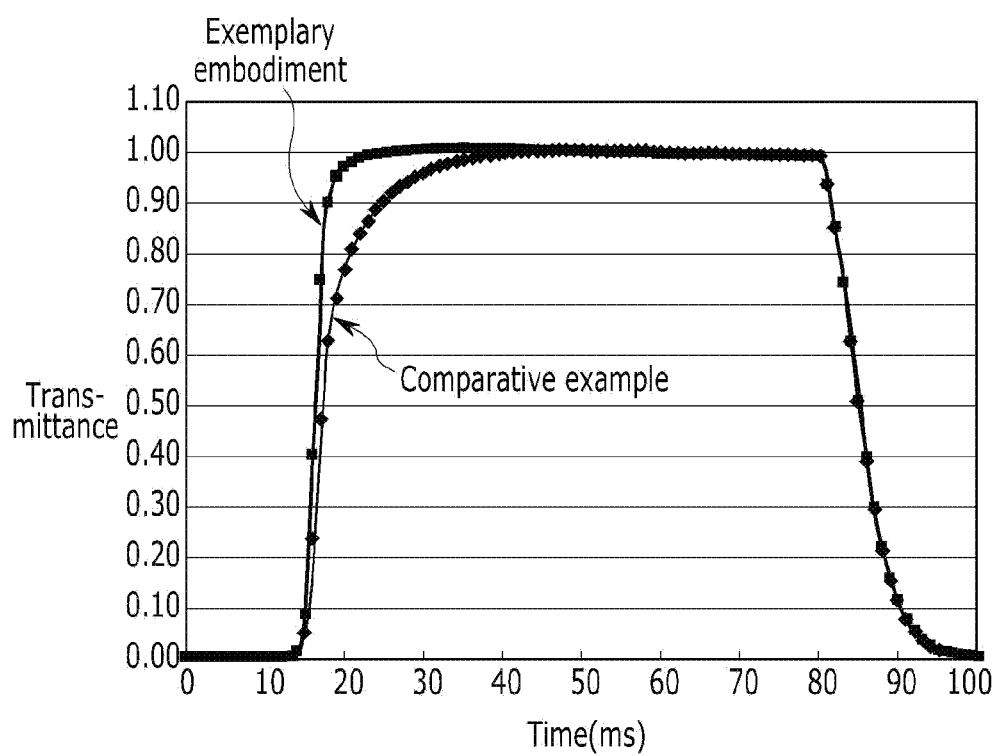
FIG. 17 is a graph showing transmittance as a function of time in a liquid crystal display according to an exemplary embodiment of the present invention.

FIG. 16 is a graph showing transmittance as a function of voltage applied to the liquid crystal layer in a liquid crystal display according to an exemplary embodiment of the present invention. FIG. 17 is a graph showing transmittance as a function of time in a liquid crystal display according to an exemplary embodiment of the present invention. The voltage applied to the liquid crystal layer is given by the difference between the voltage applied to the common electrode and data applying voltage in FIG. 16. FIG. 16 and FIG. 17 also include the transmittance values for a comparative example.

The comparative example of FIG. 16 and FIG. 17 has a liquid crystal display with a fine slit electrode and a corresponding common electrode, an electric field exposure with voltage applied to the fine slit electrode and the common electrode, and a voltage applied to the fine slit electrode and the common electrode while in operation. However, an exemplary embodiment of the present invention uses the fine slit electrode only during the electric field exposure for pretilting the liquid crystal molecules and uses the common electrode and the pixel electrode, which have no pattern, in operation such that the liquid crystal molecules are moved only by the vertical electric field.

Therefore, as shown in FIG. 16, there is no reduction in light transmittance due to the vertical electric field in the exemplary embodiment as compared with the comparative example, i.e., light transmission is enhanced in the exemplary embodiment as compared to the comparative example at increasing field strengths.

Further, in the comparative example, the sides of the fine branches distort the electric field so that vertical components of the electric field which are perpendicular to the sides of the fine branches are generated, and the inclination direction of the liquid crystal molecules is determined by the vertical components of the electric field. Therefore, the liquid crystal molecules initially tend to incline perpendicular to the sides of the fine branches (Step 1). However, since the horizontal components of the electric field due to the adjacent fine branches is opposite and the gap between the fine branches is small, the liquid crystal molecules that tend to align in opposite directions begin to incline parallel with the longitudinal direction of the fine branches (Step 2). That is, the liquid crystal molecules move in accordance with Step 1 and Step 2 in the comparative example, whereas the liquid crystal molecules are moved only by the vertical electric field, without being influenced by the fringe field according to the fine slit is electrode in an exemplary embodiment of the present invention.

Therefore, as shown in FIG. 17, in some cases, the exemplary embodiment has a faster response time than the comparative example so that a display made according to the exemplary embodiment may have a faster response time.

Figure 18:
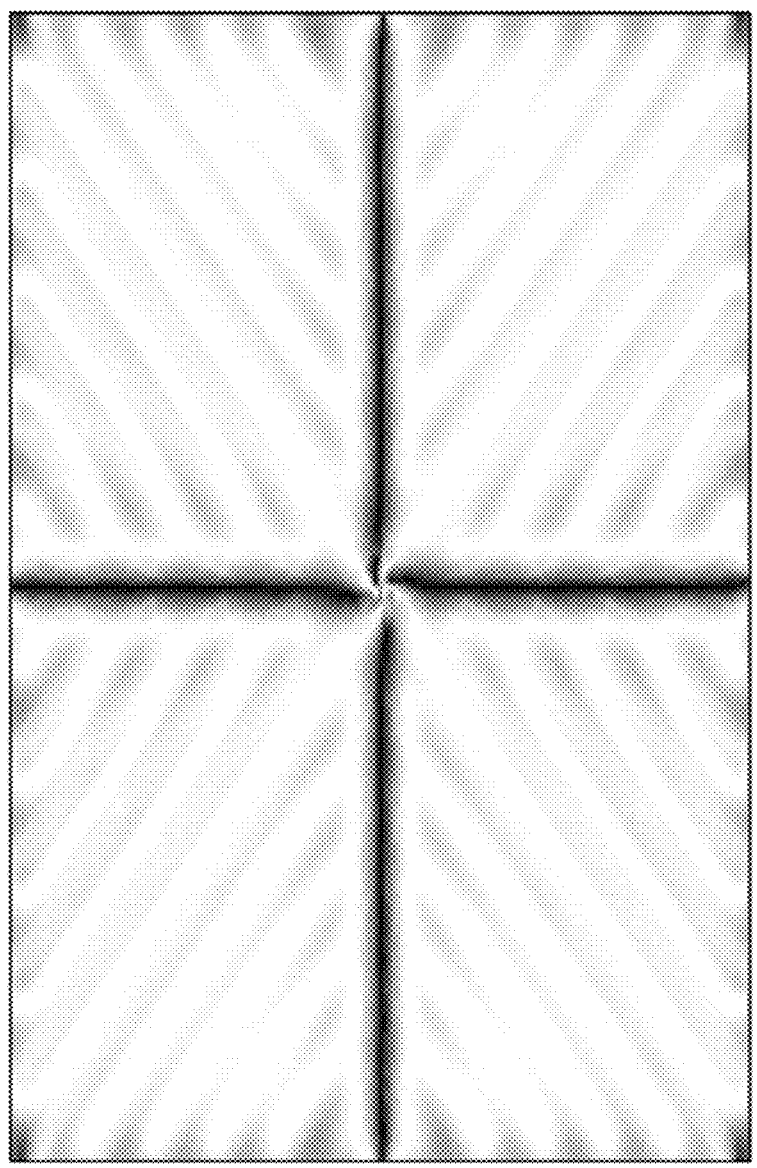
FIG. 18 is an optical microscopy picture showing a pixel region in a liquid crystal display of the related art.
Figure 19:
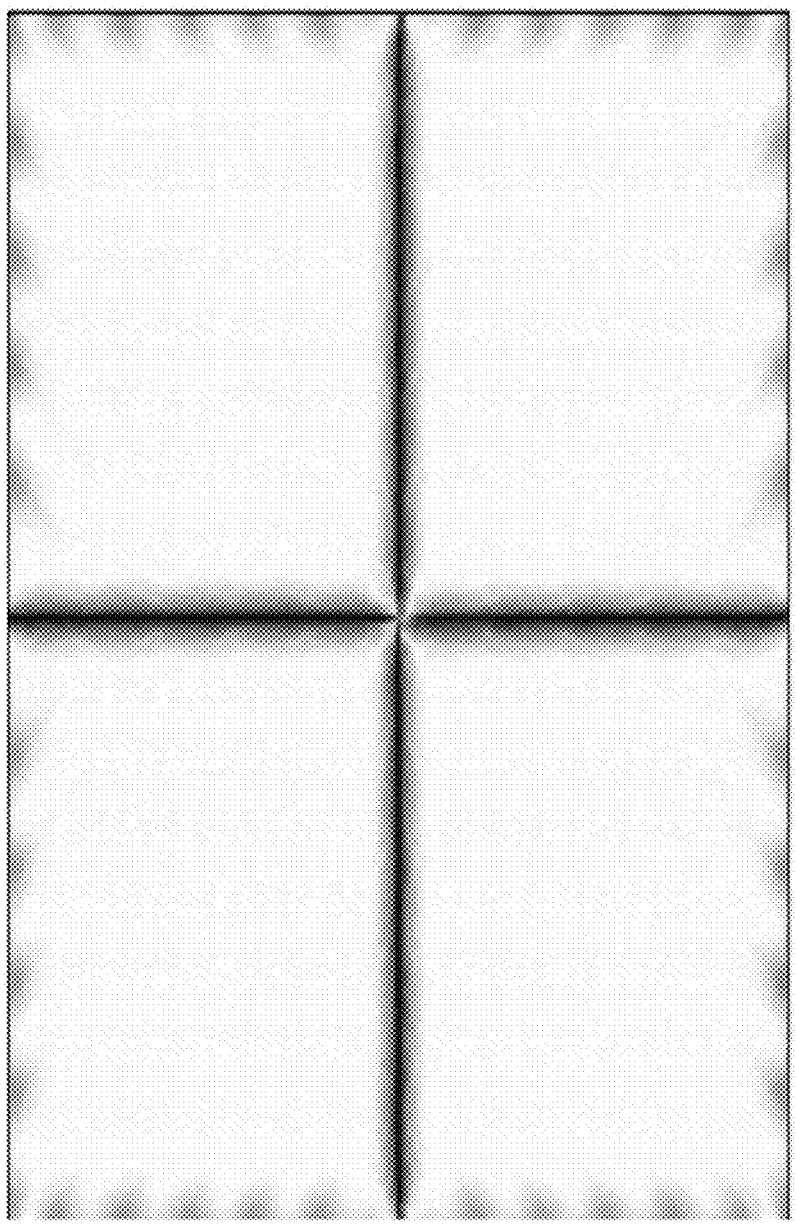
FIG. 19 is an optical microscopy picture showing a pixel electrode in a liquid crystal display according to an exemplary embodiment of the present invention.

FIG. 18 is an optical microscopy picture showing a pixel region in a liquid crystal display of the related art. FIG. 19 is an optical microscopy picture showing a pixel region in a liquid crystal display according to an exemplary embodiment of the present invention. In detail, FIG. 18 shows the pixel region of the comparative example described with reference to FIG. 16 and FIG. 17, and FIG. 19 shows the pixel region of the exemplary embodiment described with reference to FIG. 16 and FIG. 17.

Referring to FIG. 18, it can be seen that dark portions were generated in areas corresponding to non-electrodes between the fine branches due to the horizontal component of the electric field's fringe field in the comparative example. In contrast, referring to FIG. 19, there is no reduction in transmittance due to the horizontal component of the electric field because the liquid crystal molecules are moved only by the vertical electric field such that most of the dark portions do not occur in the non-electrodes areas between the fine branches in the exemplary embodiment.

FIG. 20, FIG. 21, FIG. 22, FIG. 23, FIG. 24, and FIG. 25 are cross-sectional views showing liquid crystal displays according to other exemplary embodiments of the present invention. In detail, FIG. 20, FIG. 21, FIG. 22, FIG. 23, FIG. 24, and FIG. 25 show a method of forming a short point around fine slit electrodes for electric field exposure and a common electrode for operation.

Figure 20:
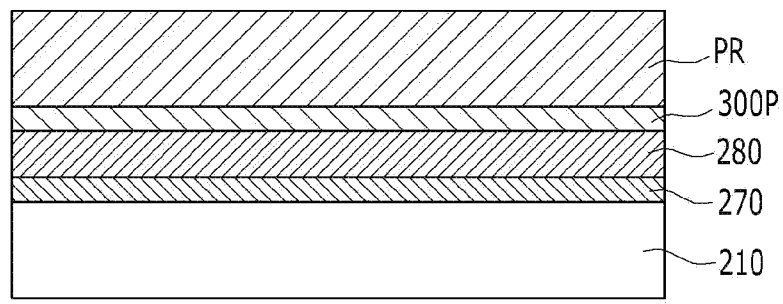
FIG. 20, FIG. 21, FIG. 22, FIG. 23, FIG. 24, and FIG. 25 are cross-sectional views showing liquid crystal displays according to additional exemplary embodiments of the present invention.

Referring to FIG. 20, a common electrode 270, an insulating layer 280, and a is transparent conductive layer 300p are formed on a substrate 210. The common electrode 270 may be made of ITO.

A photoresist PR is disposed on the transparent conductive layer 300p.

Figure 21:
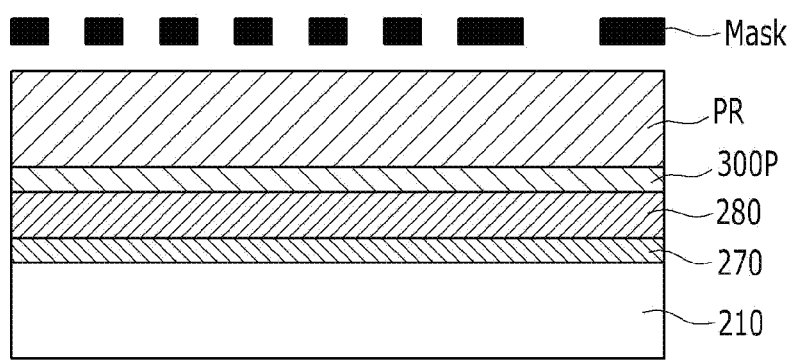
Figure 22:
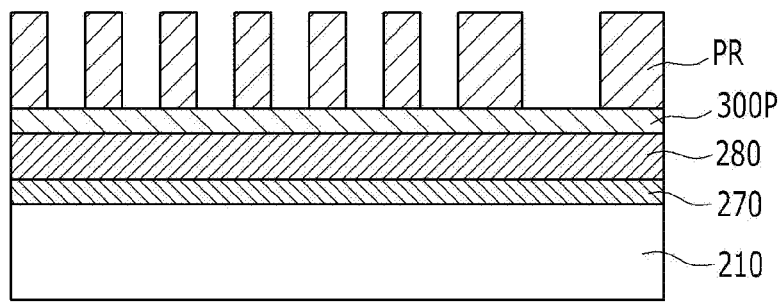
Figure 23:
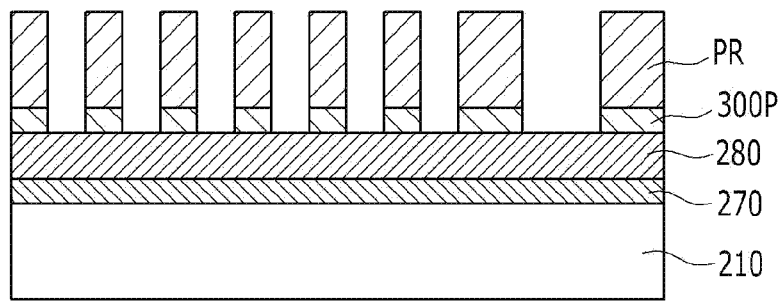

Referring to FIG. 21, FIG. 22, and FIG. 23, a slit mask (Mask) is disposed on the photoresist PR and light is radiated to the structure. Thereafter, the region of the photoresist PR that has been exposed to the irradiated light may be removed, and the exposed portion of the transparent conductive layer 300p may be removed by, for example, wet etching.

Figure 24:
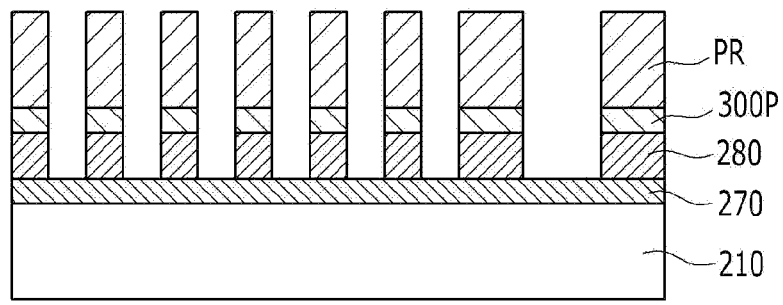

Referring to FIG. 24, a portion of the insulating layer 280 is removed by, for example, dry etching, and the photoresist PR may be maintained during the dry etch.

Figure 25:
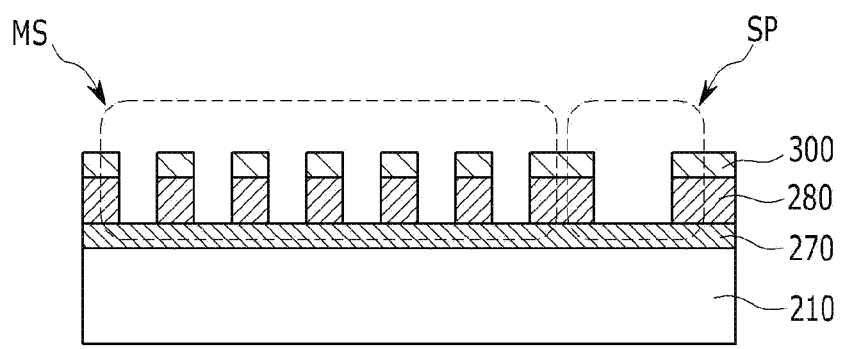

Finally, referring to FIG. 25, the photoresist PR is removed. In this process, the fine slit electrode 300 is formed, and the short point SP is formed. The short points SP are the portion where a pattern for applying voltage to the common electrode 270 or the fine slit electrode 300 may be formed.

Manufacturing cost and time for each step may be reduced by using one mask.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a liquid crystal display, the method comprising:
    forming a first electrode on a first substrate;
    forming an insulating layer on the first electrode;
    forming a second electrode on the insulating layer;
    forming a thin film transistor on a second substrate;
    forming a third electrode connected to the thin film transistor;
    forming an alignment layer on at least one of the second electrode and the third electrode;
    assembling the first substrate with the second substrate, the second substrate facing the first substrate;
    disposing a liquid crystal layer between the first substrate and the second substrate;
    applying different voltages to the second electrode and the third electrode; and
    radiating light to the liquid crystal layer while applying the different voltages to the second electrode and the third electrode,
    wherein the second electrode comprises a fine slit structure, and
    wherein at least one of the liquid crystal layer and the alignment layer comprises a sub-alignment substance.

2. The method of claim 1, further comprising:
    forming a gate line on the second substrate; and
    forming a data line crossing the gate line and disposed on the second substrate,
    wherein the thin film transistor is connected to the gate line and the data line.

3. The method of claim 2, further comprising:
    applying a first voltage (V1) to the first electrode,
    wherein applying different voltages to the second electrode and the third electrode comprises:
        applying a second voltage (V2) to the second electrode; and
        applying a third voltage (V3) to the third electrode, and
    wherein the first voltage, the second voltage, and the third voltage satisfy the condition that $|V2-V3| \geq |V1-V3|$.

4. The method of claim 3, wherein applying different voltages to the second electrode and the third electrode comprises:
    changing the second voltage while maintaining the first voltage and the third voltage.

5. The method of claim 4, further comprising:
    increasing the first voltage after beginning the change in the second voltage.

6. The method of claim 1, further comprising:
    radiating light to the liquid crystal layer in the absence of an electric field in the liquid crystal layer after radiating light to the liquid crystal layer while applying the different voltages to the second electrode and the third electrode.

7. The method of claim 1, wherein forming the first electrode, the insulating layer, and the second electrode on the first substrate comprises:
    sequentially forming a first transparent electrode layer, an insulating layer, and a second transparent electrode layer on the first substrate;
    forming a photoresist pattern on the second transparent electrode layer;
    etching the second transparent electrode layer, using the photoresist pattern as a mask; and
    etching the insulating layer, using the photoresist pattern as a mask.

8. The method of claim 1, further comprising:
    applying a first voltage (V1) to the first electrode,
    wherein applying different voltages to the second electrode and the third electrode comprises:
        applying a second voltage (V2) to the second electrode; and
        applying a third voltage (V3) to the third electrode, and
    wherein the first voltage, the second voltage, and the third voltage satisfy the condition that $|V2-V3| \geq |V1-V3|$.

9. The method of claim 8, wherein applying different voltages to the second electrode and the third electrode comprises:
    changing the second voltage while maintaining the first voltage and the third voltage.

10. The method of claim 9, further comprising:
    increasing the first voltage after beginning the change in the second voltage.

* * * * *